US010186655B2

(12) United States Patent
Horikiri et al.

(10) Patent No.: US 10,186,655 B2
(45) Date of Patent: Jan. 22, 2019

(54) METHOD FOR MANUFACTURING FERROELECTRIC THIN FILM DEVICE

(71) Applicant: SUMITOMO CHEMICAL COMPANY, LIMITED, Tokyo (JP)

(72) Inventors: Fumimasa Horikiri, Hitachi (JP); Kenji Shibata, Hitachi (JP); Kazutoshi Watanabe, Hitachi (JP); Kazufumi Suenaga, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/559,870

(22) PCT Filed: Mar. 2, 2016

(86) PCT No.: PCT/JP2016/056452
§ 371 (c)(1),
(2) Date: Sep. 20, 2017

(87) PCT Pub. No.: WO2016/158178
PCT Pub. Date: Oct. 6, 2016

(65) Prior Publication Data
US 2018/0062068 A1 Mar. 1, 2018

(30) Foreign Application Priority Data
Mar. 30, 2015 (JP) ................. 2015-068017

(51) Int. Cl.
*H01L 41/187* (2006.01)
*H01L 41/27* (2013.01)
(Continued)

(52) U.S. Cl.
CPC .......... *H01L 41/1873* (2013.01); *C23C 14/34* (2013.01); *H01L 21/304* (2013.01);
(Continued)

(58) Field of Classification Search
CPC ........... H01L 21/02071; H01L 21/0209; H01L 41/1873; H01L 41/332; H01L 41/338;
(Continued)

(56) References Cited

U.S. PATENT DOCUMENTS 6,347,862 B1  2/2002  Kanno et al.
2002/0003123 A1*  1/2002  Lee ....................... C04B 41/009
                                              216/6
(Continued)

FOREIGN PATENT DOCUMENTS

EP   2 843 723 A1   3/2015
JP   10-286953 A   10/1998
(Continued)

OTHER PUBLICATIONS

International Search Report (PCT/ISA/210) issued in PCT/JP2016/056452, dated May 31, 2016.
(Continued)

Primary Examiner — Anita K Alanko
(74) Attorney, Agent, or Firm — Birch, Stewart, Kolasch & Birch, LLP

(57) ABSTRACT

There is provided a method for manufacturing a ferroelectric thin film device including: a lower electrode film formation step of forming a lower electrode film on a substrate; a ferroelectric thin film formation step of forming a ferroelectric thin film made of a potassium sodium niobate on the lower electrode film; a ferroelectric thin film etching step of shaping the ferroelectric thin film into a desired micro-pattern by etching; and a thin film laminated substrate cleaning step of cleaning the substrate provided the ferroelectric thin film having a desired micro-pattern as a whole with a predetermined cleaning solution after the ferroelectric thin film etching step. The predetermined cleaning solution is a solution mixture containing hydrofluoric acid and
(Continued)

ammonium fluoride, the hydrofluoric acid in the solution mixture having a molarity of 0.5 M or more and less than 5 M.

5 Claims, 1 Drawing Sheet

(51) Int. Cl.
*H01L 41/047* (2006.01)
*H01L 41/43* (2013.01)
*H01L 37/02* (2006.01)
*H01L 41/316* (2013.01)
*H01L 41/332* (2013.01)
*H01L 21/304* (2006.01)
*C23C 14/34* (2006.01)
*H01L 41/29* (2013.01)
*H01L 41/338* (2013.01)
*C23C 14/35* (2006.01)
*H01L 21/02* (2006.01)

(52) U.S. Cl.
CPC ........ *H01L 37/025* (2013.01); *H01L 41/0477* (2013.01); *H01L 41/29* (2013.01); *H01L 41/316* (2013.01); *H01L 41/332* (2013.01); *H01L 41/338* (2013.01); *H01L 41/43* (2013.01); *C23C 14/35* (2013.01); *H01L 21/0209* (2013.01); *H01L 21/02071* (2013.01)

(58) Field of Classification Search
CPC ....... H01L 41/316; H01L 41/29; H01L 41/43; H01L 41/0477; H01L 37/025; C23C 14/35
See application file for complete search history.

(56) References Cited

U.S. PATENT DOCUMENTS

| | | | |
|---|---|---|---|
| 2007/0103038 A1* | 5/2007 | Kamijo | H03H 9/02559 310/364 |
| 2008/0284543 A1 | 11/2008 | Taniguchi et al. | |
| 2010/0320871 A1 | 12/2010 | Suenaga et al. | |
| 2011/0079883 A1 | 4/2011 | Shimada et al. | |
| 2012/0025667 A1 | 2/2012 | Horikiri et al. | |
| 2012/0056508 A1 | 3/2012 | Horikiri et al. | |
| 2012/0236081 A1 | 9/2012 | Nakayama et al. | |
| 2012/0304429 A1 | 12/2012 | Horikiri et al. | |
| 2013/0038176 A1 | 2/2013 | Horikiri et al. | |
| 2014/0284302 A1 | 9/2014 | Hahiro | |
| 2014/0339962 A1 | 11/2014 | Furukawa et al. | |
| 2015/0380637 A1* | 12/2015 | Jiang | H01L 41/332 29/25.35 |
| 2016/0027996 A1* | 1/2016 | Fujii | H01L 41/0477 216/13 |

FOREIGN PATENT DOCUMENTS

| | | |
|---|---|---|
| JP | 2000-31133 A | 1/2000 |
| JP | 2005-142911 A | 6/2005 |
| JP | 2007-019302 A | 1/2007 |
| JP | 2011-192736 A | 9/2011 |
| JP | 2011-235501 A | 11/2011 |
| JP | 2012-033693 A | 2/2012 |
| JP | 2012-59760 A | 3/2012 |
| JP | 2012-59851 A | 3/2012 |
| JP | 2012-59852 A | 3/2012 |
| JP | 2013-16776 A | 1/2013 |
| JP | 2013-038322 A | 2/2013 |
| JP | 2013-225608 A | 10/2013 |
| JP | 2014-60267 A | 4/2014 |
| JP | 2014-184643 A | 10/2014 |
| JP | 2014-187094 A | 10/2014 |
| JP | 2014-203839 A | 10/2014 |
| JP | 2014-207393 A | 10/2014 |
| JP | 2015-024663 A | 2/2015 |
| JP | 2015-053417 A | 3/2015 |
| WO | WO 2014/162998 A1 | 10/2014 |

OTHER PUBLICATIONS

Minh et al., "A New Lead-Free (K,Na)NbO$_3$ Piezoelectric Material and Its Microfabrication for Micro Energy Harvester", PowerMEMS 2011, Proceedings Power MEMS, Nov. 15, 2011, pp. 237-240.
International Search Report (Form PCT/ISA/210) for International Application No. PCT/JP2016/056420, dated May 24, 2016.
International Search Report (FORM PCT/ISA/210) for International Application No. PCT/JP2016/056430, dated May 24, 2016.
International Search Report (Form PCT/ISA/210) for International Application No. PCT/JP2016/056447, dated May 17, 2016.
European Patent Office Communication and extended search report issued in the European Patent Application No. 16746410.6 dated Aug. 30, 2018.
European Patent Office Communication and extended search report issued in the European Patent Application No. 16768322.6 dated Aug. 24, 2018.
European Patent Office Communication and extended search report issued in the European Patent Application No. 16768324.2 dated Aug. 24, 2018.
European Patent Office Communication and extended search report issued in the European Patent Application No. 16768627.8 dated Aug. 27, 2018.
European Patent Office Communication and extended search report issued in the European Patent Application No. 16772062.2 dated Oct. 1, 2018.
Extended European Search Report dated Oct. 1, 2018 for Application No. 16768326.7.

* cited by examiner

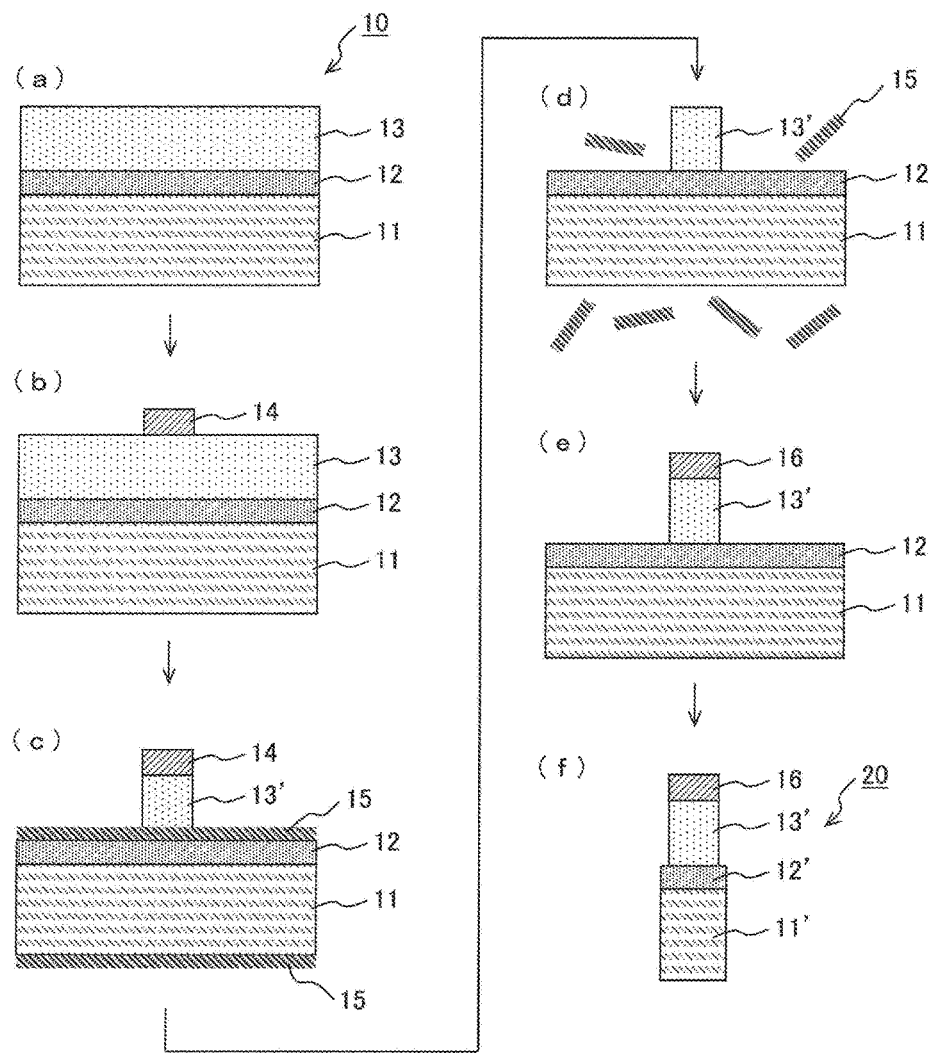

METHOD FOR MANUFACTURING FERROELECTRIC THIN FILM DEVICE

TECHNICAL FIELD OF THE INVENTION

The present invention relates to technologies regarding ferroelectric thin film devices and particularly to methods for manufacturing lead-free niobate-system ferroelectric thin film devices.

DESCRIPTION OF BACKGROUND ART

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin film devices in which a thin-film technology is utilized.

Herein, pyroelectric and piezoelectric thin film devices will be described below as representatives of such ferroelectric thin film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. Patent Literature 1 discloses a piezoelectric thin film device including, on a substrate, a lower electrode, a piezoelectric thin film and an upper electrode. The piezoelectric thin film is made of an alkali niobate-based perovskite dielectric material of a chemical formula ($Na_xK_yLi_z)NbO_3$ (where $0<x<1$, $0<y<1$, $0\leq z<1$, and $x+y+z=1$). A buffer layer of a perovskite crystal structure material is formed between the piezoelectric thin film and the lower electrode. The perovskite buffer layer is highly preferentially (001), (100), (010) or (111) oriented. According to this Patent Literature 1, the piezoelectric thin film device utilizing the lead-free lithium potassium sodium niobate thin film exhibits sufficient piezoelectric properties.

Piezoelectric devices have a basic structure of a piezoelectric material sandwiched between two electrodes and are micro-fabricated into a beam shape or a tuning fork shape depending on their application. So, micro fabrication processes are important in order to put piezoelectric devices using lead-free piezoelectric materials to practical use.

For example, Patent Literature 2 discloses a method for manufacturing a piezoelectric thin film wafer. The method includes: a first processing step of performing ion etching on a piezoelectric thin film wafer having a piezoelectric thin film (chemical formula: $(K_{1-x}Na_x)NbO_3$, $0.4\leq x\leq 0.7$) formed on a substrate using a gas containing Ar; and a second processing step of subsequently performing reactive ion etching on the wafer using a mixed etching gas of a fluorine-based reactive gas and Ar. According to this Patent Literature 2, a piezoelectric thin film can be micro-processed highly accurately, and a highly reliable piezoelectric thin film device and a low-cost piezoelectric apparatus having the piezoelectric thin film device can be obtained.

CITATION LIST

Patent Literature

Patent Literature 1: JP 2007-019302 A
Patent Literature 2: JP 2012-033693 A

SUMMARY OF THE INVENTION

Problems to be Solved by the Invention

As mentioned above, niobate-system ferroelectrics (such as potassium sodium niobate, typical chemical formula: $(K_{1-x}Na_x)NbO_3$) are among particularly promising materials as lead-free ferroelectrics. In order to put thin film devices using niobate-based ferroelectric materials as alternatives for PZTs to practical use and mass production, it is very important to develop and establish manufacturing processes that meet various requirements for their practical use and mass production.

However, since niobate-system ferroelectric thin film devices are relatively new, unexpected problems are found at every step of their research and development, and measures to solve these problems need to be examined. As a result, their manufacturing processes are still in the stage of trial and error.

For example, a study on the long-term reliability (durability) of the ferroelectricity of a potassium sodium niobate thin film device revealed that long-term characteristics varied even among test pieces that had been found to be equivalent in terms of quality in the middle of manufacturing or initial characteristics. Specifically, some exhibited stable long-term characteristics, while others deteriorated in a relatively short period of time. In other words, the thin film device has room for improvement in yield rate in terms of long-term reliability. Unfortunately, a further study to determine causes of the deterioration failed to immediately identify the causes.

In view of the foregoing, it is an objective of the present invention to provide a method for manufacturing a ferroelectric thin film device having an improved yield rate (reduced defect rate) by elucidating a deteriorating factor in the long-term reliability of a thin film device including a lead-free niobate-system ferroelectric thin film.

Solution to Problems

According to one aspect of the present invention, there is provided a method for manufacturing a ferroelectric thin film device, including a lower electrode film formation step, a ferroelectric thin film formation step, a ferroelectric thin film etching step, and a thin film laminated substrate cleaning step. In the lower electrode film formation step, a lower electrode film is formed on a substrate. In the ferroelectric thin film formation step, a ferroelectric thin film made of a potassium sodium niobate (typical chemical formula of $(K_{1-x}Na_x)NbO_3$, $0.4 \leq x \leq 0.7$) is formed on the lower electrode film. In the ferroelectric thin film etching step, the ferroelectric thin film is shaped into a desired micro-pattern by etching. In the thin film laminated substrate cleaning step, the substrate provided the ferroelectric thin film having a desired micro-pattern is cleaned as a whole with a predetermined cleaning solution after the ferroelectric thin film etching step. The predetermined cleaning solution is a solution mixture containing hydrofluoric acid (HF) and ammonium fluoride ($NH_4F$). The HF in the solution mixture has a molarity of 0.5 M (mol/L) or more and less than 5 M (mol/L).

In the above aspect of the invention, the following modifications and changes can be made.

(i) The amount of potassium (K) that is deposited on the underside of the substrate may be used as an indicator of quality determination of the thin film laminated substrate cleaning step.

(ii) When the amount of K is less than a predetermined threshold, the thin film laminated substrate cleaning step may be determined as good, and the predetermined threshold may be a detection limit of a surface atomic concentration obtained by performing quantitative analysis of K on the underside of the substrate using total reflection X-ray fluorescent analysis.

(iii) The ferroelectric thin film may have a pseudo cubic system or a tetragonal system and be formed by sputtering such that the thin film has a main surface with a (001) crystal plane preferential orientation.

(iv) The substrate may be a silicon substrate having a thermally oxidized film on its surface.

(v) The method may further include an upper electrode film formation step of forming an upper electrode film on the ferroelectric thin film.

(vi) The method may further include a dicing step of cutting out a chip-shaped ferroelectric thin film device from the substrate provided with the ferroelectric thin film having the upper electrode film formed on the ferroelectric thin film.

Advantages of the Invention

According to the present invention, it is possible to provide a method for manufacturing a ferroelectric thin film device having an improved yield rate in terms of long-term reliability. The thin film device includes a lead-free niobate system ferroelectric thin film.

BRIEF DESCRIPTION OF THE DRAWINGS

FIG. 1 is a schematic illustration showing an enlarged cross sectional view of manufacturing steps of a ferroelectric thin film device according to the present invention.

DETAILED DESCRIPTION OF THE PREFERRED EMBODIMENTS

The present inventors have focused on a sodium potassium niobate (typical chemical formula of $(K_{1-x}Na_x)NbO_3$, $0.4 \leq x \leq 0.7$, hereinafter referred to as KNN) as a lead-free ferroelectric material that can be expected to exhibit a ferroelectricity comparable to that of PZT ($Pb(Zr_{1-x}Ti_x)O_3$) and conducted research and development with an aim to put KNN thin film devices into practical use. As mentioned above, a study to examine the long-term reliability (durability) of the ferroelectricity of a potassium sodium niobate thin film device revealed that long-term characteristics varied even among test pieces that had been found to be equivalent in terms of quality in the middle of manufacturing or initial characteristics. Specifically, some exhibited stable long-term characteristics, while others deteriorated in a relatively short period of time. Unfortunately, a further study to determine causes of the deterioration failed to immediately identify the causes.

Then, the inventors further examined and analyzed test pieces whose characteristics had deteriorated in a relatively short period of time more extensively. As a result, it was found that some of the ferroelectric constituents etched off in the ferroelectric thin film etching step (alkaline metal constituents such as Na and K, in particular) were deposited on the surface of the KNN thin film laminated substrate. In other words, the surface of the KNN thin film laminated substrate can be contaminated with alkaline metal through the ferroelectric thin film etching step of forming a desired micro-pattern.

It can be considered that a mechanism for this phenomenon is redeposition and partial recombination of some of the alkaline metal constituents such as Na and K, which are highly chemically active and easy to be redeposited and recombine, to the surface of the KNN thin film laminated substrate during the etching of the KNN thin film. And, it is believed that the relatively firmly deposited alkaline metal constituents were not sufficiently removed by cleaning with pure water after the etching step. Also, the deterioration of ferroelectricity of the KNN thin film device with time would be attributed to the alkaline metal contamination with the surface of the KNN thin film laminated substrate caused through manufacturing of the thin film laminated substrate.

Moreover, this alkaline metal contamination was found not only on a surface on the KNN thin film side of the KNN thin film laminated substrate but also on a surface on the underside of the substrate. The alkaline metal contamination on the underside of the KNN thin film laminated substrate is a problem that needs to be solved as it can lead to contamination of the inside of the manufacturing apparatus (e.g. substrate holder) in the steps after the ferroelectric thin film etching step, which is a factor in secondary contamination.

As a result of intensive research on processes for cleaning up alkaline metal contaminants generated during the KNN thin film etching step, the inventors have found that alkaline metal contaminants can be cleaned up without deteriorating the KNN thin film by cleaning the KNN thin film laminated substrate as a whole after the KNN thin film etching step with a solution mixture containing HF and $NH_4F$ and having a predetermined HF molarity. Also, it has been found that the amount of K deposited on the underside of the substrate can be used as an indicator of quality determination of the thin film laminated substrate cleaning step. The present invention was made based on these findings.

Preferred embodiments of the present invention will be described below with reference to the accompanying drawings. However, the invention is not limited to the specific embodiments described below, but various combinations and modifications are possible without departing from the spirit and scope of the invention.

FIG. 1 is a schematic illustration showing an enlarged cross sectional view of manufacturing steps of a ferroelectric thin film device according to an embodiment of the invention. While the descriptions of cleaning steps other than the thin film laminated substrate cleaning step and drying steps will be omitted below, those steps are preferably performed as necessary.

First, a substrate 11 is prepared. A material of the substrate 11 is not particularly limited, and may be properly selected based on applications of the ferroelectric thin film device. For example, silicon (Si), SOI (Silicon on Insulator), quartz glass, gallium arsenide (GaAs), gallium nitride (GaN), sapphire ($Al_2O_3$), magnesium oxide (MgO), zinc oxide (ZnO), and strontium titanate ($SrTiO_3$) may be used. From the view point of cost, using Si substrates is preferable among these materials. When an electrically conductive material is used as the substrate 11, its surface is preferably covered with an electrical insulating film (e.g. an oxide film). There is no particular limitation on a method of forming the oxide film. For example, thermal oxidation and chemical vapor deposition (CVD) are suitable.

(Lower Electrode Film Formation Step)

At this lower electrode film formation step, a lower electrode film 12 is formed on the substrate 11 (see FIG. 1(a)). There is no particular limitation on a material of the lower electrode film 12; however, platinum (Pt) and an alloy mainly containing platinum are preferable. There is no particular limitation on a method for forming the lower electrode film 12 and a thickness thereof. For example, the lower electrode film 12 with a thickness of approximately 100 to 300 nm is formed preferably by a physical vaper deposition method such as sputtering, thermal evaporation, and electron beam evaporation.

The lower electrode film 12 is preferably formed via an adhesive layer (e.g. a titanium (Ti) layer with a thickness of 1 to 5 nm) to enhance the adhesion between the substrate 11 and the lower electrode film 12. Also, the lower electrode film 12 preferably has an arithmetic mean surface roughness (Ra) of 0.86 nm or less so that a later-formed niobate-system ferroelectric thin film 13 can exhibit sufficient ferroelectric properties.

(Ferroelectric Thin Film Formation Step)

At this ferroelectric thin film formation step, the ferroelectric thin film 13 is formed on the lower electrode film 12 (see FIG. 1(a)). KNN (($K_{1-x}Na_x$)$NbO_3$, 0.4≤x≤0.7) is preferable as a material of the ferroelectric thin film 13. Preferably, in order to achieve sufficient ferroelectric performance, a crystal system of the ferroelectric thin film 13 is a pseudo cubic system or a tetragonal system; and a (001) crystal plane is preferentially oriented parallel to a thin film surface. Furthermore, the ferroelectric thin film 13 preferably has the arithmetic mean surface roughness Ra of 5 nm or less.

There is no particular limitation on the formation method of the ferroelectric thin film 13 (KNN thin film) as long as a desired KNN thin film layer is obtained. Preferable formation methods include sputtering using a sintered body target having a desired chemical composition, electron beam evaporation, and pulsed laser deposition. These formation methods have advantages of excellent chemical composition controllability and crystal orientation controllability of the KNN crystal. By the steps described above, a ferroelectric thin film laminated substrate 10 can be obtained.

The KNN thin film 13 may contain one or more selected from lithium (Li), tantalum (Ta), antimony (Sb), calcium (Ca), copper (Cu), barium (Ba) and Ti in a total amount of 5 atomic percent or less.

(Etch Mask Formation Step)

In this step, on the formed ferroelectric thin film 13 (KNN thin film), an etch mask 14 against the ferroelectric thin film etching step described below is formed. There is no particular limitation on the etch mask 14 as long as it is sufficiently resistant to etching of a KNN thin film. Preferred examples include a chromium (Cr) film and a silicon oxide film (e.g. $SiO_2$ film) (see FIG. 1(b)). There is no particular limitation on the formation method of the etch mask 14, and it may preferably be formed by a photolithographic process and a lift-off process.

(Ferroelectric Thin Film Etching Step)

In this step, the ferroelectric thin film 13 (KNN thin film) is etched according to the etch mask 14 and shaped into a desired micro-pattern (see FIG. 1(c)). By this step, a patterned ferroelectric thin film 13' having a desired micro-pattern can be obtained. In the present invention, there is no particular limitation on the etching method of the KNN thin film, and any conventional method (e.g. a dry-etching process and a wet-etching process) may be used. It has been found that as a result of this step, alkaline metal contaminants 15 may be deposited on the surface of the KNN thin film laminated substrate.

(Thin Film Laminated Substrate Cleaning Step)

In this step, the alkaline metal contaminants 15 deposited on the surface of the KNN thin film laminated substrate are removed by cleaning the KNN thin film laminated substrate having a desired micro-pattern as a whole with a predetermined cleaning solution (see FIG. 1(d)). The predetermined cleaning solution is preferably a solution mixture containing HF and $NH_4F$. The HF molarity in the solution mixture is preferably 0.5 M (mol/L) or more and less than 5 M (mol/L), more preferably 2 M or more and less than 4M. The cleaning solution can be prepared by adjusting the HF molarity of a commercially available buffered hydrofluoric acid.

When the HF molarity in the cleaning solution is 5 M or more, the KNN thin film can be etched, and the surface of the KNN thin film would be roughened (More specifically, the arithmetic mean surface roughness Ra exceeds 5 nm, for example). By contrast, when the HF molarity in the cleaning solution is less than 0.5 M, the time required to remove the alkaline metal contaminants 15 (cleaning time) becomes too long. From the viewpoint of process cost reduction, the cleaning time in this step is preferably 20 minutes or less, more preferably 10 minutes or less. Considering the working stability of the thin film laminated substrate cleaning step in future mass production (e.g. working stability when cleaning many large-diameter KNN thin film laminated substrates, 100 of them for example, at the same time), it is preferable that a cleaning time of approximately 2 minutes or more be secured. It is more preferable that the cleaning with the above-described cleaning solution be followed by cleaning with pure water and drying.

Also, the quality of this step can be determined using the amount of K that is deposited on a surface of on the underside of the substrate 11 (the side on which the KNN thin film is not formed) as an indicator. For example, when a surface atomic concentration of K on the underside surface of the substrate 11 is measured by performing quantitative analysis using total reflection X-ray fluorescent analysis (TXRF), the surface atomic concentration of K less than the detection limit of the K constituent (e.g. less than $1.1 \times 10^{10}$ atoms/$cm^2$) indicates that the cleaning quality is good.

In the thin film laminated substrate cleaning step according to the present invention, the above-described quality determination process (quantitative analysis of K on the underside surface of the substrate) is not required to be performed on every KNN thin film substrate having a desired micro-pattern, but it may be performed as regular sampling inspection.

(Upper Electrode Formation Step)

In this step, an upper electrode film 16 is formed on the patterned ferroelectric thin film 13' (patterned KNN thin film) (see FIG. 1(e)). Preferable materials for the upper electrode film 16 include one selected from Pt, palladium (Pd), ruthenium (Ru), rhodium (Rh), iridium (Ir), gold (Au), and aluminum (Al). There is no particular limitation on a method for forming the upper electrode film 16 and a thickness thereof. For example, the upper electrode film 16 with a thickness of approximately 100 to 300 nm is formed preferably by a physical vaper deposition method such as sputtering, thermal evaporation, and electron beam evaporation.

The upper electrode film 16 is preferably formed via an adhesive layer (e.g. one selected from a nickel (Ni) layer, a cobalt (Co) layer, a tungsten (W) layer and a molybdenum (Mo) layer, each having a thickness of 2 to 30 nm) to enhance the adhesion between the patterned ferroelectric thin film 13' and the upper electrode film 16.

(Dicing Step)

At this dicing step, the substrate provided with the patterned ferroelectric thin film 13' and the upper electrode film 16 is diced into a chip of a ferroelectric thin film device 20 (see FIG. 1(f)). Meanwhile, the reference numeral 11' designates the diced substrate of the chip 20, and numeral 12' designates the lower electrode in the chip 20. Thus, the formation of the ferroelectric thin film device chip 20 having thereon a desired fine pattern of the ferroelectric thin film is completed.

In the descriptions above, the upper electrode film formation step is performed after the ferroelectric thin film etching step. However, the present invention is not limited to this, and the ferroelectric thin film etching step may be performed after the upper electrode film formation step. Also, the timing of the dicing step is not restricted by the above description of the step sequence. It is noted, however, that the thin film laminated substrate cleaning step is preferably performed immediately after the ferroelectric thin film etching step, from the viewpoint of preventing spread of the alkaline metal contamination.

EXAMPLES

The present invention will be described more specifically below by way of examples. However, the invention is not limited to the specific examples below.

[Fabrication of Ferroelectric Thin Film-on-Substrate]

The KNN thin film-on-substrates 10 were fabricated according to the manufacturing steps illustrated in FIG. 1. As the substrate 11, a 4-inch (100) Si wafer with thermal oxide film (Si wafer thickness of 0.525 mm; oxide film thickness of 200 nm; and surface roughness Ra of wafer of 0.86 nm) was used.

In the film formation steps below, the thickness of each layer was controlled by controlling the film formation time based on the film formation rate determined in advance. Also, the thickness measurement for calculation of each film formation rate was conducted by the X-ray reflectivity technique using an X-ray diffractometer (X'Pert PRO MRD, available from PANalytical B.V., Spectris Co., Ltd.).

First, a 2.2-nm thick Ti layer was formed on the Si substrate 11 by RF magnetron sputtering as a lower electrode adhesive layer to enhance adhesion between the substrate 11 and the lower electrode film 12. Subsequently, the lower electrode film 12 was formed by forming a 205-nm thick Pt layer on the Ti adhesive layer by RF magnetron sputtering (see FIG. 1(a)). The sputtering conditions for the Ti adhesive layer and the Pt lower electrode film 12 were as follows: targets of pure Ti (for the Ti adhesive layer) and pure Pt (for the Pt electrode film); substrate temperature of 250° C.; discharge power of 200 W; sputtering gas of Ar; and gas pressure of 2.5 Pa. The sputtering was carried out using a RF sputtering machine (SH-350-T10, available from ULVAC, Inc.) (the same machine was used in all the remaining sputtering processes described below).

The lower electrode film 12 was subjected to the surface roughness measurement with an atomic force microscopy (AFM) and observed to have an arithmetic mean roughness Ra of 0.86 nm or less. The Ra measurement was conducted by scanning a region of 1 μm×1 μm with a pitch of 4 nm using a probe having a tip curvature radius of 2 nm or less (the same applies hereinafter).

After the formation of the Pt lower electrode film 12, the ferroelectric thin film 13 was formed by forming a 1.9-μm thick KNN (($K_{0.35}Na_{0.65}$)$NbO_3$) thin film on the lower electrode film 12 by RF magnetron sputtering (see FIG. 1(a)). The sputtering condition for the KNN thin film 13 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and gas pressure of 0.3 to 1.3 Pa.

(Evaluation of KNN Thin Film)

Normally, perovskite KNN crystals have a tetragonal structure in which the c-axis is longer than the a-axis (c/a>1). That is, when formed KNN crystals satisfy the crystalline condition of "c/a>1", the crystals are more stable and the crystallinity thereof is high. When an electric field is applied along the c-axis of a perovskite-type ferroelectric crystal with a small initial strain, a larger polarization (and thus a higher gain in piezoelectric or ferroelectric performance) is obtained.

On the other hand, unlike bulk crystals, thin-film crystals formed on a substrate are prone to distortion caused by the influence of the substrate or the underlayer. Specifically, the KNN thin film formed on a substrate may have a pseudo cubic crystal system with "c/a≤1" (herein meaning "a system closer to a cubic crystal system than to a proper tetragonal crystal system") or a tetragonal crystal system with "c/a>1" (herein meaning "a system closer to a proper tetragonal crystal system"). Therefore, the crystal system of each of the KNN thin films formed above was evaluated by X-ray diffraction (XRD). The result showed that the KNN thin film laminated substrates, each of which was provided with the KNN thin film mainly having a tetragonal system with "c/a>1", were obtained.

Also, each of the formed KNN thin films was subjected to the surface roughness measurement using an AFM and observed to have an arithmetic mean roughness Ra of 2.1 nm.

[KNN Thin Film Etching Test]

First, as the etch mask formation step, a photoresist pattern was formed on each of the KNN thin films by applying, exposing, and developing a photoresist (OFPR-800, available from TOKYO OHKA KOGYO CO., LTD.). Next, a Cr film having a thickness of 400 nm was formed by RF magnetron sputtering. The Cr film formation by sputtering was conducted using a pure Cr target in an Ar atmosphere at a discharge power of 50 W and a gas pressure of 0.8 Pa without heating the substrate. Subsequently, the photoresist pattern was removed or lifted off using a resist removing liquid (JELK series, available from Kanto Chemical Co., Inc.) to form an etch mask 14 (Cr film) on each of the KNN thin films (see FIG. 1(b)).

Then, each of the KNN thin films was dry-etched according to the etch mask 14 using a reactive ion etcher (EIS-700, available from ELIONIX INC.) as a dry etching apparatus (see FIG. 1(c)). The dry etching conditions were as follows: antenna power density of 44 mW/mm$^2$; bias power density of 5 mW/mm$^2$; etching gas of Ar and perfluorocyclobutane (C$_4$F$_8$); and gas pressure of 0.5 Pa. After the etching of the KNN thin film, each of the etch masks 14 was removed using an etchant for Cr (second cerium ammonium nitrate).

[Thin Film Laminated Substrate Cleaning Test]

The thin film laminated substrate cleaning step was performed on each of the etched KNN thin film laminated substrates using cleaning solutions having different HF molarities (see FIG. 1(d)).

Preparation of Conventional Example

First, a test piece of Conventional Example was prepared without performing the thin film laminated substrate cleaning step. By this Conventional Example, a level of the alkaline contamination caused by the KNN thin film etching can be grasped.

(Preparation of Reference Sample)

As a reference sample without alkaline metal contamination caused by the KNN thin film etching, an Si simple substrate was prepared. By this reference sample, the most cleanest state can be grasped.

Fabrication of Comparative Example 1

A test piece of Comparative Example 1 was fabricated by performing the thin film laminated substrate cleaning step using a cleaning solution of buffered hydrofluoric acid having an HF molarity of 0.4 M (BHF1100, available from Daikin Industries, Ltd.). This Comparative Example 1 is an example where the HF molarity of the cleaning solution falls below the minimum value specified in the present invention.

Fabrication of Examples 1 to 5

A test piece of Example 1 was fabricated by performing the thin film laminated substrate cleaning step using a cleaning solution of buffered hydrofluoric acid having an HF molarity of 0.9 M (BHF130, available from Daikin Industries, Ltd.). Similarly, a test piece of Example 2 was fabricated by performing the thin film laminated substrate cleaning step using a cleaning solution of buffered hydrofluoric acid having an HF molarity of 2.6 M (BHF110, available from Daikin Industries, Ltd.); a test piece of Example 3 was fabricated by performing the thin film laminated substrate cleaning step using a cleaning solution of buffered hydrofluoric acid having an HF molarity of 3.2 M (BHF63, available from Daikin Industries, Ltd.); a test piece of Example 4 was fabricated by performing the thin film laminated substrate cleaning step using a cleaning solution of buffered hydrofluoric acid having an HF molarity of 3.9 M (BHF16, available from Daikin Industries, Ltd.); and a test piece of Example 5 was fabricated by performing the thin film laminated substrate cleaning step using a cleaning solution of buffered hydrofluoric acid having an HF molarity of 4.9 M (a solution mixture of BHF16 and 49 mass % HF in a "5:1" ratio).

Fabrication of Comparative Example 2

A test piece of Comparative Example 2 was fabricated by performing the thin film laminated substrate cleaning step using a cleaning solution of buffered hydrofluoric acid having an HF molarity of 5.6 M (a solution mixture of BHF 16 and 49 mass % HF in a "4:1" ratio). This Comparative Example 2 is an example where the HF molarity of the cleaning solution exceeds the maximum value specified in the invention.

(Evaluation of Alkaline Metal Contamination)

Quantitative analysis of Na and K was performed on the underside surface of each of the substrates of the reference sample, Comparative Examples 1 and 2, and Examples 1 to 5 using total reflection X-ray fluorescent analysis (TXRF). The results of quantitative analysis are shown in Table 1 below together with the thin film laminated substrate cleaning conditions.

(Evaluation of Surface Roughness of KNN Thin Film)

The KNN thin film of each of the reference sample, Comparative Examples 1 and 2, and Examples 1 to 5 was subjected to surface roughness measurement using an AFM to obtain an arithmetic mean surface roughness Ra. The measurement results are shown also in Table 1.

TABLE 1

Conditions of thin film laminated substrate cleaning step; results of surface atomic concentrations of Na and K; and results of surface roughness.

| | Thin Film Laminated Substrate Cleaning Conditions | | Surface Atomic Concentration ($\times 10^{10}$ atoms/cm$^2$) | | Arithmetic Mean Surface Roughness (nm) |
|---|---|---|---|---|---|
| | HF Molarity (M) | Cleaning Time (s) | Na | K | |
| Conventional Example | No Cleaning | | <160 | 15.3 | 2.1 |
| Reference Sample | No Cleaning | | <270 | <1.1 | 0.3 |
| Comparative Example 1 | 0.4 | 1200 | <190 | 2.2 | 2.2 |
| Example 1 | 0.9 | 700 | <190 | <1.1 | 2.2 |
| Example 2 | 2.6 | 220 | <170 | <1.1 | 2.3 |
| Example 3 | 3.2 | 200 | <170 | <1.1 | 2.1 |
| Example 4 | 3.9 | 150 | <160 | <1.1 | 2.3 |
| Example 5 | 4.9 | 150 | <170 | <1.1 | 4.1 |
| Comparative Example 2 | 5.6 | 90 | <200 | <1.1 | 5.5 |

As shown in Table 1, Conventional Example is a specimen prepared without performing the thin film laminated substrate cleaning step, and surface deposition of the K constituent (surface contamination) is observed. As for the Na constituent, because its detection limit, $10^{12}$ atoms/cm$^2$, is more than two orders of magnitude larger than that of the K constituent, it is impossible to determine the presence or absence of its surface deposition. Furthermore, in Conventional Example since the thin film laminated substrate cleaning step was not performed, there is no particular change in the surface roughness (arithmetic mean surface roughness Ra) of the KNN thin film.

The reference sample served as a benchmark for the state without surface contamination (the cleanest state), and the surface atomic concentration of the K constituent was less than the detection limit (in this test, $1.1 \times 10^{10}$ atoms/cm$^2$). As for the Na component, as with Conventional Example, it is impossible to determine the presence of absence of its surface deposition. Judging from comparison between the reference sample and Conventional Example, it can be said that the presence or absence of alkaline metal contamination should preferably be determined by using the surface atomic concentration of the K constituent as an indicator. It can also be said that the threshold for the determination should preferably be the detection limit in the measurement.

Comparative Example 1 is a specimen prepared by performing the thin film laminated substrate cleaning step using a cleaning solution having an HF molarity less than the minimum value specified in the invention, and its alkaline metal contaminants could not be sufficiently removed even with the cleaning time of 1,200 seconds. However, there is no particular change in the arithmetic mean surface roughness Ra of the KNN thin film.

Examples 1 to 5 are specimens each prepared by performing the thin film laminated substrate cleaning step according to the embodiment of the invention, and it is observed that the alkaline metal contaminants in each specimen are sufficiently removed within a preferable cleaning time range. It is also observed that the arithmetic mean roughness Ra of the KNN thin film of each specimen is not particularly affected by the cleaning step.

Comparative Example 2 is a specimen prepared by performing the thin film laminated substrate cleaning step using a cleaning solution having an HF molarity more than the maximum value specified in the present invention, and it is observed that its alkaline metal contaminants are sufficiently removed even with a short cleaning time. However, the arithmetic mean surface roughness Ra of the KNN thin film exceeds 5 nm. It is believed that the KNN thin film was etched by the cleaning solution.

[Fabrication of Ferroelectric Thin Film Device and Evaluation of Characteristics]

The upper electrode film formation step (in this test, the formation of a Pt film) was performed on each of the KNN thin film laminated substrates subjected to the thin film laminated substrate cleaning test described above. Subsequently, the dicing step was performed on each substrate to fabricate 100 chips of the ferroelectric thin film device 20 for evaluation of characteristics (see FIG. 1(*f*)).

The ferroelectric thin film devices of Examples 1 to 5 and Comparative Example 2, from which alkaline metal contaminants had been sufficiently removed, were subjected to polarization measurement using a system for ferroelectricity evaluation. The results show that the ferroelectric thin film devices of Examples 1 to 5 almost completely matched with each other in polarization (the hysteresis loop of the polarization value), which confirms that the thin film laminated substrate cleaning step according to the embodiment of the invention does not particularly affect ferroelectricity. Meanwhile, the ferroelectric thin film devices of Comparative Example 2 were clearly deteriorated in polarization than those of Examples 1 to 5. This would be attributable to the roughening of the surface of the KNN thin film in Comparative Example 2 due to the thin film laminated substrate cleaning step.

Next, the ferroelectric thin film devices of Conventional Example, Comparative Example 1, and Examples 1 to 5 were each subjected to an acceleration test of the long-term reliability. In the test, $10^{11}$ cycles (about 28 hours) of a 100 kHz, a 30 V alternating current sine wave was applied to each of the devices in an atmospheric environment. If the remanent polarization value 2Pr of the device after the test had deteriorated by less than 10% as compared to that before the test, the device was determined to be "acceptable", and if it had deteriorated by 10% or more, the device was determined to be "unacceptable".

The test results show that the combined defect rate of Examples 1 to 5 was 0.6%, while the defect rate (the percentage of unacceptable devices) of Conventional Example was 21%, and the defect rate of Comparative Example 1 was 5%. In other words, it is confirmed that the yield rate in terms of long-term reliability can be drastically improved by performing the thin film laminated substrate cleaning step according to the embodiment of the invention.

The above embodiments and examples of the invention as well as the appended claims and figures show multiple characterizing features of the invention in specific combinations. The skilled person will easily be able to consider further combinations or sub-combinations of these features in order to adapt the invention as defined in the claims to his specific needs.

LEGEND

10 . . . ferroelectric thin film laminated substrate;
11 . . . substrate;
11' . . . diced substrate of chip;
12 and 12' . . . lower electrode film;
13 . . . ferroelectric thin film;
13' . . . patterned ferroelectric thin film;
14 . . . etch mask;
15 . . . alkaline metal contaminant;
16 . . . upper electrode film; and
20 . . . ferroelectric thin film device.

The invention claimed is:

1. A method for manufacturing a ferroelectric thin film device, the method comprising:
    a lower electrode film formation step of forming a lower electrode film on a substrate, the substrate having an underside;
    a ferroelectric thin film formation step of forming a ferroelectric thin film made of a potassium sodium niobate, (chemical formula of $(K_{1-x}Na_x)NbO_3$, $0.4 \leq x \leq 0.7$, on the lower electrode film;
    a ferroelectric thin film etching step of shaping the ferroelectric thin film into a desired micro-pattern by etching; and
    a thin film laminated substrate cleaning step of cleaning the substrate provided the ferroelectric thin film having the desired micro-pattern as a whole with a predetermined cleaning solution after the ferroelectric thin film etching step, wherein
    the predetermined cleaning solution is a solution mixture containing hydrofluoric acid and ammonium fluoride, the hydrofluoric acid in the solution mixture having a molarity of 0.5 M or more and less than 5 M,
    wherein an amount of potassium is deposited on the underside of the substrate,
    wherein the amount of potassium deposited on the underside of the substrate is used as an indicator of quality determination of the thin film laminated substrate cleaning step,
    wherein when the amount of potassium is less than a predetermined threshold, the thin film laminated substrate cleaning step is determined as positive, and
    wherein the predetermined threshold is a detection limit of a surface atomic concentration obtained by performing quantitative analysis of potassium on the underside of the substrate using total reflection X-ray fluorescent analysis.

2. The method for manufacturing a ferroelectric thin film device according to claim 1, wherein
    the ferroelectric thin film has a pseudo cubic system or a tetragonal system and is formed by sputtering such that the thin film has a main surface with a (001) crystal plane preferential orientation.

3. The method for manufacturing a ferroelectric thin film device according to claim 1, wherein
the substrate is a silicon substrate having a thermally oxidized film on its surface.

4. The method for manufacturing a ferroelectric thin film device according to claim 1, the method further comprising an upper electrode film formation step of forming an upper electrode film on the ferroelectric thin film.

5. The method for manufacturing a ferroelectric thin film device according to claim 1, the method further comprising a dicing step of cutting out a chip-shaped ferroelectric thin film device from the substrate provided with the ferroelectric thin film having the upper electrode film formed on the ferroelectric thin film.

* * * * *